(12) United States Patent
Ono et al.

(10) Patent No.: US 7,015,535 B2
(45) Date of Patent: Mar. 21, 2006

(54) NONVOLATILE SEMICONDUCTOR MEMORY DEVICE

(75) Inventors: Takashi Ono, Tokyo (JP); Shoji Kitazawa, Tokyo (JP); Teruhiro Harada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/837,700

(22) Filed: May 4, 2004

(65) Prior Publication Data

US 2005/0247969 A1  Nov. 10, 2005

(51) Int. Cl.
*H01L 29/76* (2006.01)

(52) U.S. Cl. ...................... 257/314; 438/276
(58) Field of Classification Search ................ 257/314, 257/213, 218, 379, 390; 438/276
See application file for complete search history.

(56) References Cited

U.S. PATENT DOCUMENTS 4,935,791 A  6/1990 Namaki et al.
5,978,258 A * 11/1999 Manning ..................... 365/175
6,816,414 B1 * 11/2004 Prinz ..................... 365/185.29

FOREIGN PATENT DOCUMENTS

JP           2511485         4/1996

* cited by examiner

*Primary Examiner*—David Nelms
*Assistant Examiner*—Quoc Hoang
(74) *Attorney, Agent, or Firm*—Volentine Francos & Whitt, PLLC

(57) ABSTRACT

A nonvolatile semiconductor memory device includes a plurality of memory cells. A couple of bits of data can be stored in the memory cell, the stored data being controlled according to resistance values of first and second variable resistance regions. One of the plurality of memory cells shares its first diffusion layer with an adjacent memory cell and shares its second diffusion layer with another adjacent memory cell. The first diffusion layers of the plurality of memory cells are coupled to each other with a first conductive line extending in a first direction. The second diffusion layers of the plurality of memory cells are coupled to each other with a second conductive line extending in the first direction. The gate electrodes of the plurality of memory cells are coupled to each other with a third conductive line extending in a second direction, which is orthogonal to the first direction.

13 Claims, 4 Drawing Sheets

NONVOLATILE SEMICONDUCTOR MEMORY DEVICE

TECHNICAL FIELD OF THE INVENTION

This invention relates to a nonvolatile semiconductor memory device, which is capable to store a couple of bits of data therein.

BACKGROUND OF THE INVENTION

The U.S. Pat. No. 4,935,791 descries a nonvolatile memory device storing a couple of bits of data therein. The U.S. Pat. Nos. 5,768,192; 6,011,725; 6,255,166 and 6,399,441 also describe a nonvolatile memory device in which plural bits of data can be stored in a single memory cell.

According to a conventional type of nonvolatile memory, the memory is unstable in operation due to unevenness of parasitic resistance.

OBJECTS OF THE INVENTION

Accordingly, an object of the present invention is to provide a high performance nonvolatile memory device which is operable reliably with less affection from parasitic resistance.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to an aspect of the present invention, a nonvolatile semiconductor memory device includes a plurality of memory cells, each of which includes:

(1) a first conductive type of semiconductor substrate;
(2) first and second diffusion layers formed on the semiconductor substrate, the diffusion layers being of a second conductive type;
(3) a channel region formed between the first and second diffusion layers;
(4) a gate insulating layer formed on the channel region;
(5) a gate electrode formed on the gate insulating layer;
(6) a first variable resistance region, which is formed outside the first diffusion layer and is of the second conductive type; and
(7) a second variable resistance region, which is formed outside the second diffusion layer and is of the second conductive type.

A couple of bits of data are stored in the memory cell, the stored data being controlled according to resistance values of the first and second variable resistance regions. One of the memory cells shares its first diffusion layer with an adjacent memory cell and shares its second diffusion layer with another adjacent memory cell. The first diffusion layers of the plurality of memory cells are coupled to each other with a first conductive line extending in a first direction. The second diffusion layers of the plurality of memory cells are coupled to each other with a second conductive line extending in the first direction. The gate electrodes of the plurality of memory cells are coupled to each other with a third conductive line extending in a second direction, which is orthogonal to the first direction.

Preferably, each of the memory cells further comprises first and second charge storage regions formed on the first and second variable resistance regions, respectively so that resistance values of the first and second variable resistance regions are controlled by changing amounts of electric charge stored in the first and second charge storage regions, respectively.

Each of the first and second charge storage regions may be of an O—N—O insulating layer. The first and second conductive lines may be bit lines, and the third conductive line may be a word line.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
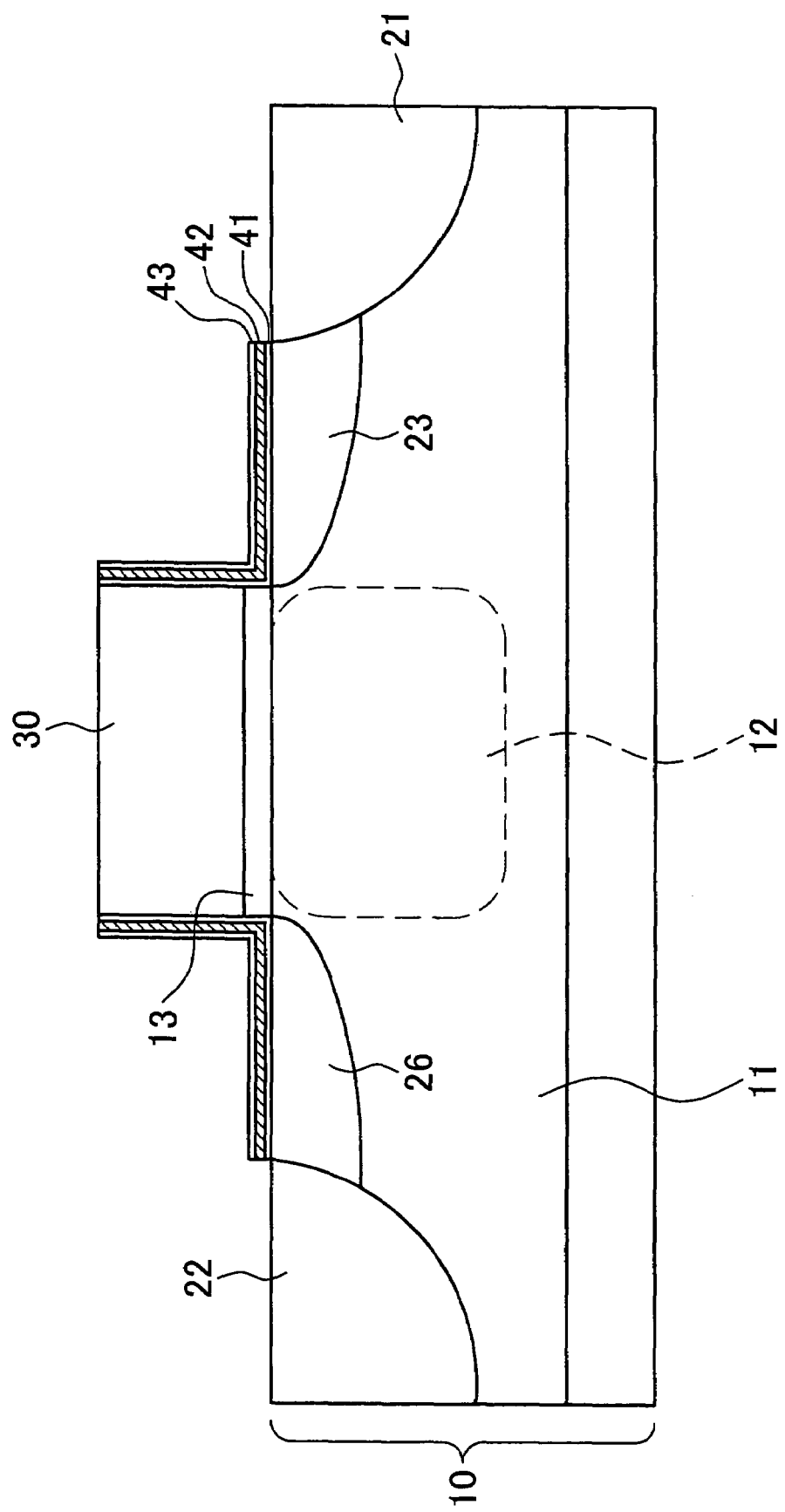
FIG. 1 is a cross-sectional view illustrating a memory cell used in a nonvolatile semiconductor memory device according to a first preferred embodiment of the present invention.

FIG. 1 is a cross-sectional view illustrating a memory cell used in a nonvolatile semiconductor memory device according to a first preferred embodiment of the present invention. As shown in FIG. 1, a memory cell includes a P-type silicon substrate 10. A P-type well region 11 is formed in the semiconductor substrate 10. N+ type of diffusion layers 21 and 22, which are drain and source, are formed in the P-type well region 11 with a predetermined distance. A channel region 12 is formed between the diffusion layers 21 and 22. A variable resistance region 23 is formed between the channel region 12 and the diffusion layer 21, while a variable resistance region 26 is formed between the channel region 12 and the diffusion layer 22.

A gate-insulating layer 13 is formed on the channel region 12, and a gate electrode 30 is formed on the gate-insulating layer 13. Charge storage regions (41–43) are formed on the variable resistance regions 23 and 26. The charge storage regions are of O—N—O layered insulating layers 41–43 to store a predetermined amount of electrical charge therein. Actually, a silicon nitride layer 42 is capable to store electrical charge. Resistance values of the variable resis tance regions 23 and 26 are controlled in accordance with the amount of charge stored in the silicon nitride layer 42, so that two bits of data can be stored in a single memory cell.

Figure 2:
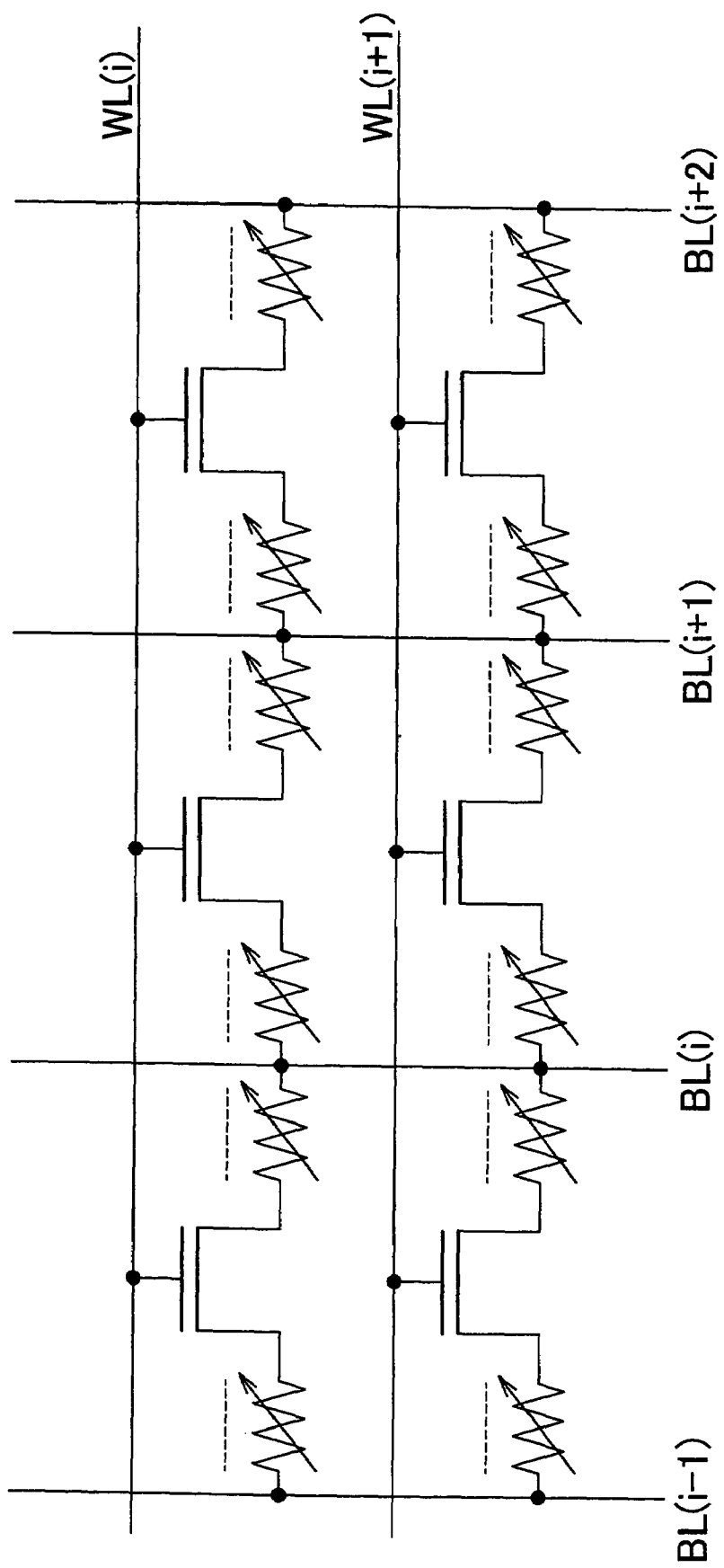
FIG. 2 is a circuit diagram showing a nonvolatile memory device according to the first preferred embodiment.

FIG. 2 is a circuit diagram showing a nonvolatile memory device according to the first preferred embodiment. The memory cell includes variable resistance circuits, connected at both source and drain of the transistor. In such a transistor circuit, reading and writing operation is carried out in the opposite direction. When a predetermined amount of electric charge is stored, the resistance value is increased and the stored data can be detected. In other words, the transistor stores data having a level, which is changed in accordance with the resistance value of the variable resistance circuits.

Figure 3:
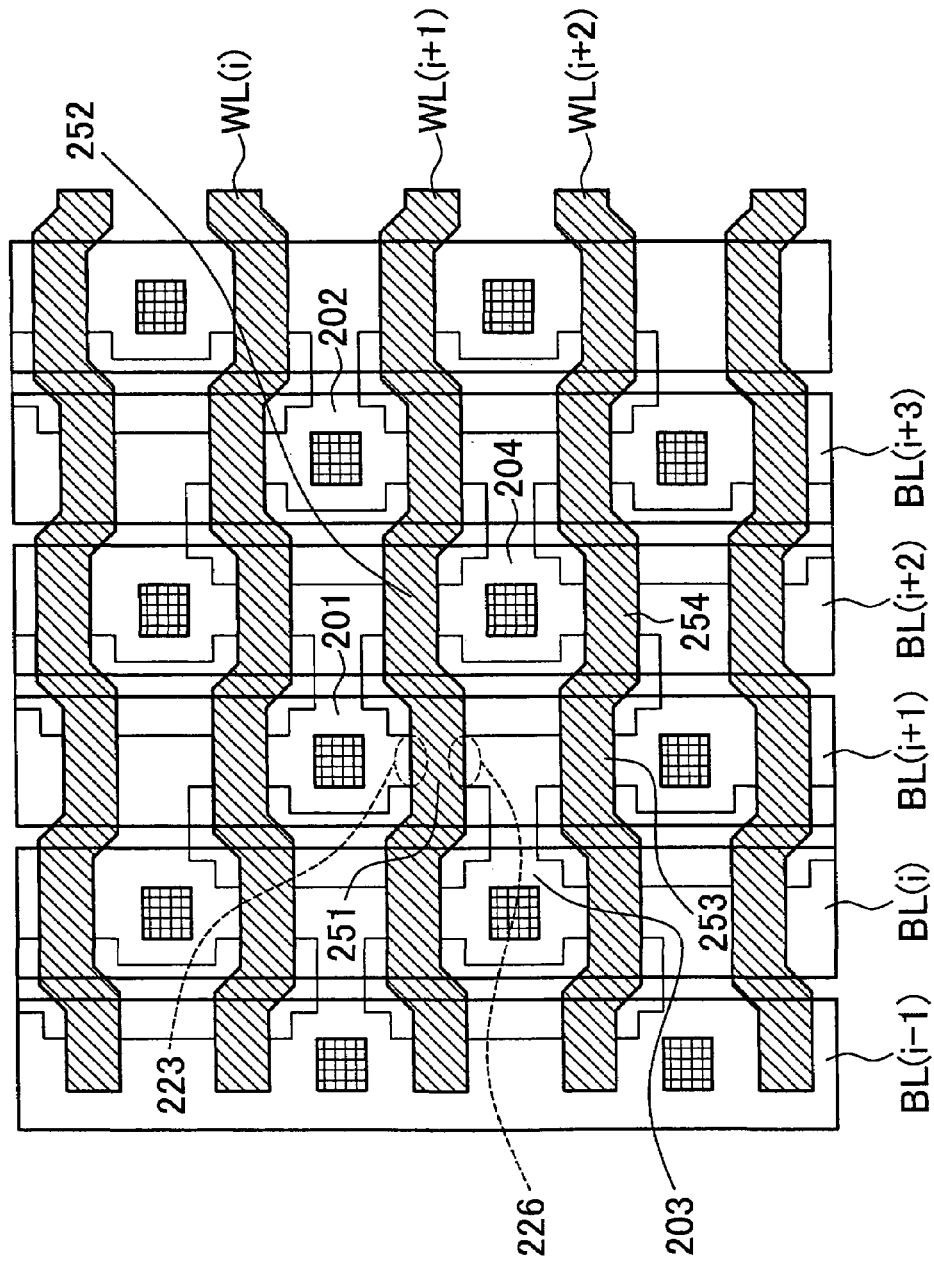
FIG. 3 is a conceptual diagram showing a layout of a nonvolatile memory device according to the first preferred embodiment.

FIG. 3 is a conceptual diagram showing a layout of a nonvolatile memory device according to the first preferred embodiment. Drain regions 201–204 are connected to metal bit lines BL(i+1), BL(i+3), BL(i) and BL(i+2), respectively, via contacts. Gates of memory cells (transistors) 251 and 252 are connected to word line WL(i+1), and gates of memory cells (transistors) 253 and 254 are connected to word line WL(i+2).

A feature of the embodiment is that a virtual ground system is employed to connect the memory cells using only bit lines, which may be metal lines.

Reference numerals 223 and 226 represent variable resistance regions, which are corresponding to 23 and 26 in FIG. 1, encircled by broken lines. In each memory cell, two bits of data are stored at drain and source sides.

When a predetermined voltage is applied between the bit lines BL(i) and BL(i+1) and the word line WL(i+1) is selected, the memory cell transistor 251 is operated. In order to read data stored at the region 223, the diffusion layer 201, connected to the metal bit line BL(i+1), and the diffusion layer 203, connected to the metal bit line BL(i), function as source and drain, respectively. On the other hand, in order to read data stored at the region 226, the diffusion layer 203, connected to the metal bit line BL(i), and the diffusion layer 201, connected to the metal bit line BL(i+2), function as source and drain, respectively.

In order to operate the memory cell transistor 252, a predetermined voltage is applied between the bit lines BL(i+1) and BL(i+2), the word line WL(i+1) is selected and the diffusion layers 201 and 204 are used as source and drain. According to a voltage value applied to the selected bit lines, two bits of data can be written in and read out.

According to the first preferred embodiment, no common source line is used, so that resistance of a diffusion layer is caused by a short distance to an adjacent bit line. As a result, parasitic resistance is minimized, and therefore, the memory cell array is operable stably and reliably. Further, the word lines are extending in a first direction in parallel to each other, and the bit lines are extending in a second direction, which is orthogonal to the first direction. Uniformity of characteristics of memory cell transistors can be obtained. According to the first preferred embodiment, no floating gate is employed.

Figure 4:
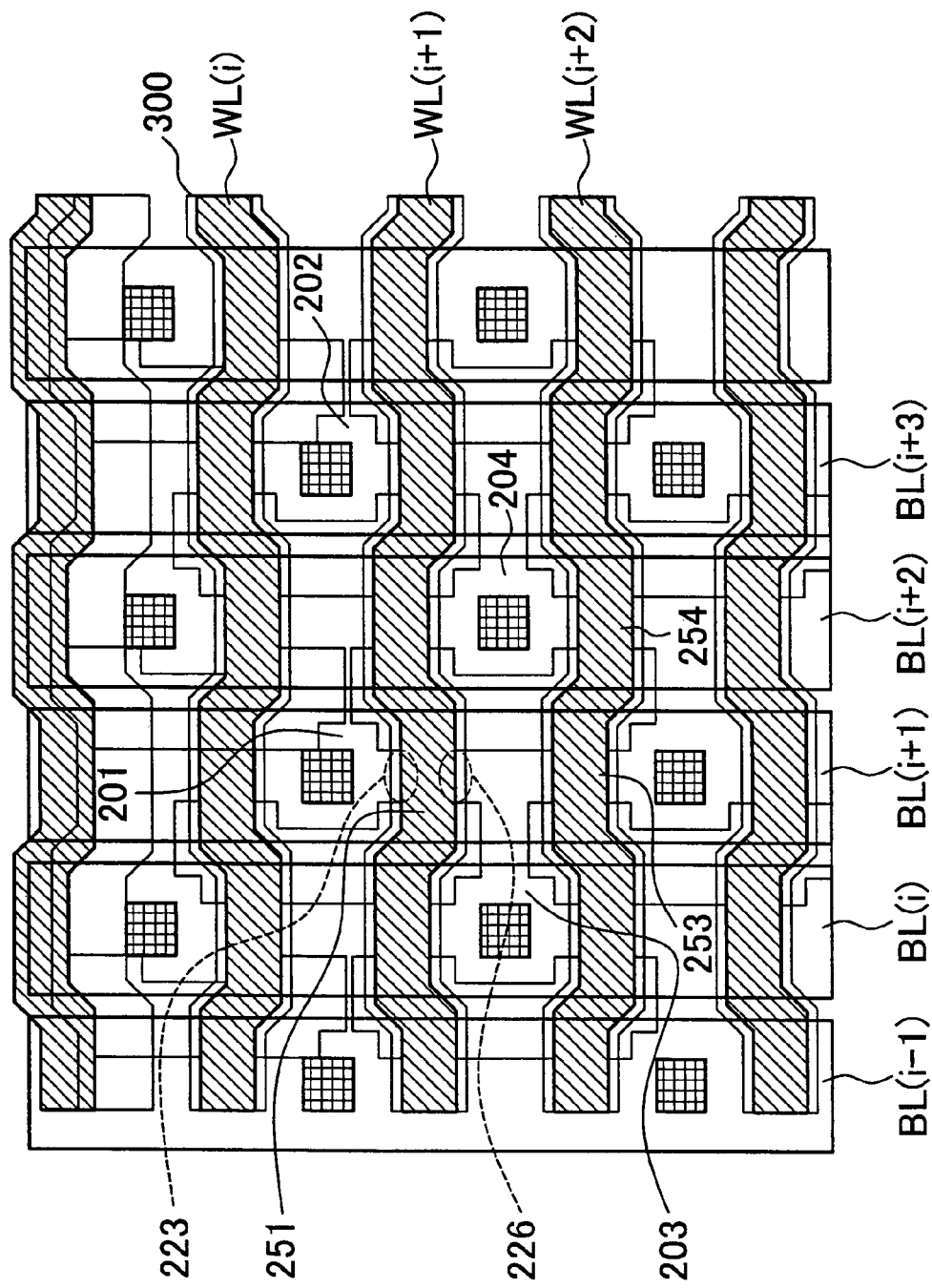
FIG. 4 is a conceptual diagram showing a layout of a nonvolatile memory device according to a second preferred embodiment of the present invention.

FIG. 4 is a conceptual diagram showing a layout of a nonvolatile memory device according to a second preferred embodiment of the present invention. The difference from the first preferred embodiment is that side walls 300 are provided. The other structures are the same as those of the first preferred embodiment. The side walls 300 are formed on sides of the gate electrodes 30 along with the word lines WL(i).

What is claimed is:

1. A nonvolatile semiconductor memory device, comprising:
   a plurality of memory cells, each of which includes:
      a first conductive type of semiconductor substrate;
      first and second diffusion layers formed on the semiconductor substrate, the diffusion layers being of a second conductive type;
      a channel region formed between the first and second diffusion layers;
      a gate insulating layer formed on the channel region;
      a gate electrode formed on the gate insulating layer;
      a first variable resistance region, which is formed outside the first diffusion layer and is of the second conductive type;
      a second variable resistance region, which is formed outside the second diffusion layer and is of the second conductive type;
   wherein a couple of bits of data are stored in the memory cell, the stored data being controlled according to resistance values of the first and second variable resistance regions,
   wherein one of the memory cells shares its first diffusion layer with an adjacent memory cell and shares its second diffusion layer with another adjacent memory cell,
   wherein the first diffusion layers of the plurality of memory cells are coupled to each other with a first conductive line extending in a first direction,
   wherein the second diffusion layers of the plurality of memory cells are coupled to each other with a second conductive line extending in the first direction, and
   wherein the gate electrodes of the plurality of memory cells are coupled to each other with a third conductive line extending in a second direction, which is orthogonal to the first direction.

2. A nonvolatile semiconductor memory device according to claim 1, wherein
   each of the plurality of memory cells further comprises first and second charge storage regions formed on the first and second variable resistance regions, respectively so that resistance values of the first and second variable resistance regions are controlled by changing amounts of electric charge in the first and second charge storage regions, respectively.

3. A nonvolatile semiconductor memory device according to claim 2, wherein
   each of the first and second charge storage regions is of a O—N—O insulating layer.

4. A nonvolatile semiconductor memory device according to claim 1, wherein
   the first and second conductive types are P-type and N-type, respectively.

5. A nonvolatile semiconductor memory device according to claim 4, wherein
   the third conductive line is a word line.

6. A nonvolatile semiconductor memory device according to claim 5, further comprising:
   a side wall, provided on a side of and along the word line.

7. A nonvolatile semiconductor memory device according to claim 1, wherein
   the first and second conductive lines are bit lines.

8. A nonvolatile semiconductor memory device according to claim 1, wherein
   the first and second resistance variable regions are N-type diffusion layers.

9. A nonvolatile semiconductor memory device according to claim 1, further comprising:
a side wall, provided on a side of the gate electrode.

10. A nonvolatile semiconductor memory device according to claim 9, wherein
the side wall is provided along the third conductive line.

11. A nonvolatile semiconductor memory device, comprising:
a plurality of memory cells, each of which includes:
a first conductive type of semiconductor substrate;
first and second diffusion layers formed on the semiconductor substrate, the diffusion layers being of a second conductive type;
a channel region formed between the first and second diffusion layers;
a gate insulating layer formed on the channel region;
a gate electrode formed on the gate insulating layer;
a first variable resistance region, which is formed outside the first diffusion layer and is of the second conductive type;
a second variable resistance region, which is formed outside the second diffusion layer and is of the second conductive type;
first and second charge storage regions formed on the first and second variable resistance regions, respectively so that resistance values of the first and second variable resistance regions are controlled by changing amounts of electric charge in the first and second charge storage regions, respectively;
wherein a couple of bits of data are stored in the memory cell, the stored data being controlled according to resistance values of the first and second variable resistance regions,
wherein one of the plurality of memory cells shares its first diffusion layer with an adjacent memory cell and shares its second diffusion layer with another adjacent memory cell,
wherein the first diffusion layers of the plurality of memory cells are coupled to each other with a first bit line extending in a first direction,
wherein the second diffusion layers of the plurality of memory cells are coupled to each other with a second bit line extending in the first direction, and
wherein the gate electrodes of the plurality of memory cells are coupled to each other with a word line extending in a second direction, which is orthogonal to the first direction.

12. A nonvolatile semiconductor memory device according to claim 11, wherein
each of the first and second charge storage regions is of a O—N—O insulating layer,
the first and second resistance variable regions are N-type diffusion layers.

13. A nonvolatile semiconductor memory device according to claim 11, further comprising:
a side wall, provided on a side of and along the word line.

* * * * *